(12) United States Patent
Shieh et al.

(10) Patent No.: US 11,735,477 B2
(45) Date of Patent: Aug. 22, 2023

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Ming-Feng Shieh, Yongkang (TW); Hung-Chang Hsieh, Hsin-Chu (TW); Wen-Hung Tseng, Luodong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 148 days.

(21) Appl. No.: 16/880,718

(22) Filed: May 21, 2020

(65) Prior Publication Data

US 2020/0286782 A1    Sep. 10, 2020

Related U.S. Application Data

(60) Continuation of application No. 14/875,535, filed on Oct. 5, 2015, now Pat. No. 10,672,656, which is a
(Continued)

(51) Int. Cl.
*H01L 29/417* (2006.01)
*H01L 29/423* (2006.01)
(Continued)

(52) U.S. Cl.
CPC .. *H01L 21/76897* (2013.01); *H01L 21/28079* (2013.01); *H01L 21/28088* (2013.01);
(Continued)

(58) Field of Classification Search
CPC ........... H01L 23/5226; H01L 23/53295; H01L 23/53214; H01L 23/53233;
(Continued)

(56) References Cited

U.S. PATENT DOCUMENTS

| | | |
|---|---|---|
| 5,151,168 A | 9/1992 | Gilton |
| 5,451,543 A | 9/1995 | Woo |

(Continued)

FOREIGN PATENT DOCUMENTS

| | | |
|---|---|---|
| CN | 101483184 | 7/2009 |
| CN | 102768848 | 11/2012 |

(Continued)

OTHER PUBLICATIONS

Korean Application No. 10-2014-0148126, Office Action dated Oct. 22, 2015, 17 pgs.

*Primary Examiner* — Sophia T Nguyen
(74) *Attorney, Agent, or Firm* — Haynes and Boone, LLP

(57) ABSTRACT

A method of fabricating a semiconductor integrated circuit (IC) is disclosed. A first conductive feature and a second conductive feature are provided. A first hard mask (HM) is formed on the first conductive feature. A patterned dielectric layer is formed over the first and the second conductive features, with first openings to expose the second conductive features. A first metal plug is formed in the first opening to contact the second conductive features. A second HM is formed on the first metal plugs and another patterned dielectric layer is formed over the substrate, with second openings to expose a subset of the first metal plugs and the first conductive features. A second metal plug is formed in the second openings.

20 Claims, 9 Drawing Sheets

Related U.S. Application Data division of application No. 14/066,889, filed on Oct. 30, 2013, now Pat. No. 9,153,483.

(51) Int. Cl.

| | | |
|---|---|---|
| *H01L 27/092* | (2006.01) | |
| *H01L 21/8234* | (2006.01) | |
| *H01L 21/768* | (2006.01) | |
| *H01L 21/28* | (2006.01) | |
| *H01L 21/8238* | (2006.01) | |
| *H01L 29/43* | (2006.01) | |
| *H01L 29/49* | (2006.01) | |
| *H01L 29/51* | (2006.01) | |
| *H01L 21/321* | (2006.01) | |
| *H01L 23/532* | (2006.01) | |
| *H01L 23/528* | (2006.01) | |
| *H01L 23/522* | (2006.01) | |
| *H01L 23/485* | (2006.01) | |
| *H01L 21/4763* | (2006.01) | |
| *H01L 21/3105* | (2006.01) | |
| *H01L 29/66* | (2006.01) | |

(52) U.S. Cl.
CPC .... *H01L 21/28141* (2013.01); *H01L 21/3212* (2013.01); *H01L 21/7684* (2013.01); *H01L 21/7688* (2013.01); *H01L 21/76816* (2013.01); *H01L 21/76819* (2013.01); *H01L 21/76831* (2013.01); *H01L 21/76834* (2013.01); *H01L 21/76846* (2013.01); *H01L 21/76879* (2013.01); *H01L 21/823425* (2013.01); *H01L 21/823475* (2013.01); *H01L 21/823821* (2013.01); *H01L 21/823864* (2013.01); *H01L 21/823871* (2013.01); *H01L 21/823878* (2013.01); *H01L 23/485* (2013.01); *H01L 23/5226* (2013.01); *H01L 23/5283* (2013.01); *H01L 23/53214* (2013.01); *H01L 23/53233* (2013.01); *H01L 23/53257* (2013.01); *H01L 27/0924* (2013.01); *H01L 29/41775* (2013.01); *H01L 29/42372* (2013.01); *H01L 29/435* (2013.01); *H01L 29/4958* (2013.01); *H01L 29/4966* (2013.01); *H01L 29/517* (2013.01); *H01L 29/518* (2013.01); *H01L 21/31055* (2013.01); *H01L 21/4763* (2013.01); *H01L 21/76852* (2013.01); *H01L 21/76861* (2013.01); *H01L 21/76865* (2013.01); *H01L 21/76883* (2013.01); *H01L 21/76885* (2013.01); *H01L 21/823828* (2013.01); *H01L 23/53295* (2013.01); *H01L 29/66545* (2013.01); *H01L 2924/0002* (2013.01)

(58) Field of Classification Search
CPC . H01L 23/53257; H01L 27/0203–0207; H01L 27/07–0705; H01L 27/088; H01L 27/105; H01L 21/823475; H01L 29/41725; H01L 29/41775; H01L 29/4232–42372
See application file for complete search history.

(56) References Cited

U.S. PATENT DOCUMENTS

| | | | |
|---|---|---|---|
| 5,592,024 A | 1/1997 | Aoyama | |
| 5,935,868 A * | 8/1999 | Fang | H01L 23/5226 |
| | | | 438/692 |
| 6,037,223 A * | 3/2000 | Su | H01L 27/11521 |
| | | | 438/257 |
| 6,077,770 A | 6/2000 | Hsu | |
| 6,124,192 A | 9/2000 | Jeng | |
| 6,168,704 B1 | 1/2001 | Brown | |
| 6,174,800 B1 | 1/2001 | Jang | |
| 6,214,662 B1 | 4/2001 | Sung et al. | |
| 6,251,790 B1 * | 6/2001 | Jeong | H01L 21/76844 |
| | | | 438/697 |
| 6,258,712 B1 | 7/2001 | Wang | |
| 6,348,414 B1 | 2/2002 | Yun | |
| 6,370,306 B1 | 4/2002 | Sato | |
| 6,380,071 B1 | 4/2002 | Onuma | |
| 6,387,759 B1 | 5/2002 | Park | |
| 6,445,050 B1 * | 9/2002 | Chediak | H01L 23/485 |
| | | | 257/401 |
| 6,495,888 B1 | 12/2002 | Yamato | |
| 6,511,912 B1 | 1/2003 | Chopra | |
| 6,518,671 B1 | 2/2003 | Yang | |
| 6,528,418 B1 | 3/2003 | Kim | |
| 6,544,850 B1 | 4/2003 | Schnabel | |
| 6,750,140 B2 | 6/2004 | Hohnsdorf | |
| 6,781,182 B2 | 8/2004 | Drynan | |
| 6,787,469 B2 | 9/2004 | Houston | |
| 6,797,611 B1 | 9/2004 | Wu et al. | |
| 7,078,334 B1 | 7/2006 | Chowdhury | |
| 7,157,333 B1 | 1/2007 | Kim | |
| 7,166,536 B1 | 1/2007 | Laermer | |
| 7,396,759 B1 | 7/2008 | Van Schravendijk | |
| 7,563,701 B2 | 7/2009 | Chang | |
| 7,696,086 B2 | 4/2010 | Hsu | |
| 7,767,533 B2 | 8/2010 | Kim | |
| 7,811,941 B1 | 10/2010 | Becker | |
| 7,880,303 B2 | 2/2011 | Yu | |
| 7,956,386 B2 * | 6/2011 | Bae | H01L 21/76834 |
| | | | 257/213 |
| 8,288,238 B2 | 10/2012 | Huang | |
| 8,513,809 B2 * | 8/2013 | Ueda | H01L 23/5222 |
| | | | 257/773 |
| 8,536,040 B1 | 9/2013 | Park | |
| 8,679,909 B2 | 3/2014 | Xie et al. | |
| 8,759,920 B2 * | 6/2014 | Wann | H01L 21/76897 |
| | | | 257/368 |
| 8,816,444 B2 * | 8/2014 | Wann | H01L 27/0207 |
| | | | 257/401 |
| 8,836,129 B1 | 9/2014 | Hung et al. | |
| 8,962,464 B1 | 2/2015 | Chang et al. | |
| 9,105,497 B2 | 8/2015 | Hong | |
| 9,153,483 B2 * | 10/2015 | Shieh | H01L 21/28141 |
| 9,184,095 B2 | 11/2015 | Scheiper | |
| 9,425,105 B1 | 8/2016 | Basker | |
| 9,461,143 B2 * | 10/2016 | Pethe | H01L 21/28008 |
| 9,589,807 B1 | 3/2017 | Huang | |
| 9,941,162 B1 | 4/2018 | Chanemougame | |
| 10,037,943 B2 | 7/2018 | Zhao | |
| 10,049,929 B2 * | 8/2018 | Hung | H01L 23/485 |
| 10,211,302 B2 * | 2/2019 | Cheng | H01L 29/41791 |
| 10,672,656 B2 * | 6/2020 | Shieh | H01L 21/76834 |
| 11,322,394 B2 * | 5/2022 | Wang | H01L 29/41775 |
| 2001/0005611 A1 | 6/2001 | Kim | |
| 2002/0025669 A1 | 2/2002 | Hwang et al. | |
| 2002/0081799 A1 | 6/2002 | Kim | |
| 2002/0090837 A1 | 7/2002 | Chung | |
| 2002/0096734 A1 * | 7/2002 | Natsume | H01L 27/11 |
| | | | 257/E27.099 |
| 2002/0105088 A1 | 8/2002 | Yang | |
| 2002/0158286 A1 * | 10/2002 | Chediak | H01L 21/76838 |
| | | | 257/325 |
| 2002/0187625 A1 | 12/2002 | Shimooka | |
| 2003/0000923 A1 * | 1/2003 | Ko | H01J 37/32963 |
| | | | 257/E21.507 |
| 2003/0015732 A1 | 1/2003 | Park | |
| 2003/0032219 A1 | 2/2003 | Nam | |
| 2003/0077891 A1 * | 4/2003 | Drynan | H01L 21/76837 |
| | | | 438/630 |
| 2003/0127705 A1 | 7/2003 | Kwak | |
| 2003/0139027 A1 * | 7/2003 | Ikeda | H01L 21/823828 |
| | | | 257/E21.654 |
| 2003/0162353 A1 | 8/2003 | Park | |
| 2004/0084709 A1 * | 5/2004 | Kim | H01L 27/10894 |
| | | | 257/306 |

(56) References Cited

U.S. PATENT DOCUMENTS

| | | | |
|---|---|---|---|
| 2004/0104419 A1* | 6/2004 | Bohr | H01L 21/76897 257/308 |
| 2004/0110368 A1 | 6/2004 | Hui | |
| 2004/0121599 A1 | 6/2004 | Aminpur | |
| 2004/0137675 A1* | 7/2004 | Park | H01L 29/6653 438/197 |
| 2004/0140564 A1* | 7/2004 | Lee | H01L 27/14636 257/E21.579 |
| 2004/0192026 A1 | 9/2004 | Chen | |
| 2004/0195608 A1* | 10/2004 | Kim | H01L 27/10855 257/E21.507 |
| 2004/0241917 A1 | 12/2004 | Schwan et al. | |
| 2005/0051852 A1* | 3/2005 | Kim | H01L 27/11 257/E27.098 |
| 2005/0085072 A1 | 4/2005 | Kim | |
| 2005/0095763 A1* | 5/2005 | Samavedam | H01L 21/28079 438/197 |
| 2005/0139912 A1* | 6/2005 | Koh | H01L 29/66621 257/E21.429 |
| 2005/0142756 A1 | 6/2005 | Park et al. | |
| 2005/0205943 A1* | 9/2005 | Yamada | H01L 27/224 257/E27.102 |
| 2005/0247926 A1* | 11/2005 | Sun | H01L 29/1054 257/19 |
| 2006/0022352 A1* | 2/2006 | Moore | H01L 24/03 257/786 |
| 2006/0051948 A1 | 3/2006 | Kim | |
| 2006/0113604 A1* | 6/2006 | Tigelaar | H01L 23/485 257/E21.627 |
| 2006/0263985 A1 | 11/2006 | Kang et al. | |
| 2006/0266448 A1 | 11/2006 | Arai et al. | |
| 2006/0267106 A1* | 11/2006 | Chao | H01L 21/823864 257/E21.64 |
| 2006/0281217 A1* | 12/2006 | Hideki | G11C 13/0004 438/210 |
| 2007/0059919 A1 | 3/2007 | Ooka | |
| 2007/0066047 A1 | 3/2007 | Ye | |
| 2007/0077741 A1 | 4/2007 | Frohberg | |
| 2007/0087554 A1 | 4/2007 | Louis | |
| 2007/0093050 A1 | 4/2007 | Son | |
| 2007/0123040 A1 | 5/2007 | Hwang | |
| 2007/0249151 A1 | 10/2007 | Kadoya | |
| 2008/0011999 A1* | 1/2008 | Choi | H01L 45/1233 257/E45.001 |
| 2008/0048226 A1* | 2/2008 | Heo | H01L 27/11502 257/295 |
| 2008/0073694 A1 | 3/2008 | Wilier | |
| 2008/0166874 A1 | 7/2008 | Deligianni | |
| 2008/0253160 A1 | 10/2008 | Popp | |
| 2008/0254608 A1 | 10/2008 | Seo | |
| 2008/0258310 A1 | 10/2008 | Fukumoto | |
| 2009/0002118 A1 | 1/2009 | Gasparyan | |
| 2009/0014796 A1 | 1/2009 | Liaw | |
| 2009/0090996 A1* | 4/2009 | Koo | H01L 27/10888 257/532 |
| 2009/0140431 A1* | 6/2009 | Feustel | H01L 23/53238 257/E21.495 |
| 2009/0159978 A1 | 6/2009 | Matsubara | |
| 2009/0223043 A1 | 9/2009 | Hsu | |
| 2009/0224327 A1 | 9/2009 | Liou | |
| 2009/0230479 A1 | 9/2009 | Hsu et al. | |
| 2009/0289324 A1 | 11/2009 | Goodlin | |
| 2010/0044869 A1 | 2/2010 | Zhang | |
| 2010/0055857 A1 | 3/2010 | Lin et al. | |
| 2010/0093168 A1 | 4/2010 | Naik | |
| 2010/0197097 A1* | 8/2010 | Hasunuma | H01L 21/823871 257/E21.409 |
| 2010/0197141 A1 | 8/2010 | Tu | |
| 2010/0227448 A1* | 9/2010 | Koo | H01L 27/10894 438/381 |
| 2010/0308380 A1* | 12/2010 | Rothwell | H01L 21/76807 257/E29.255 |
| 2011/0042752 A1 | 2/2011 | Mayuzumi | |
| 2011/0062502 A1 | 3/2011 | Yin et al. | |
| 2011/0084289 A1 | 4/2011 | Tseng | |
| 2011/0101426 A1* | 5/2011 | Frohberg | H01L 21/76841 257/E21.409 |
| 2011/0123783 A1 | 5/2011 | Sherrer | |
| 2011/0156107 A1 | 6/2011 | Bohr et al. | |
| 2011/0156162 A1 | 6/2011 | Richter et al. | |
| 2011/0156166 A1 | 6/2011 | Huang et al. | |
| 2011/0215409 A1 | 9/2011 | Li | |
| 2011/0260264 A1* | 10/2011 | Luo | H01L 21/823835 257/412 |
| 2011/0269303 A1 | 11/2011 | Marxsen | |
| 2011/0272765 A1* | 11/2011 | Seo | H01L 29/78 257/410 |
| 2011/0272767 A1 | 11/2011 | Yin | |
| 2011/0278654 A1* | 11/2011 | Ueda | H01L 21/76801 257/296 |
| 2011/0281413 A1* | 11/2011 | Zhong | H01L 21/76831 257/E21.409 |
| 2012/0025317 A1 | 2/2012 | Zhong | |
| 2012/0032275 A1 | 2/2012 | Haran | |
| 2012/0043592 A1* | 2/2012 | Zhao | H01L 23/53266 438/653 |
| 2012/0043614 A1 | 2/2012 | Choi et al. | |
| 2012/0086054 A1* | 4/2012 | Cheng | H01L 29/7833 257/E21.409 |
| 2012/0086057 A1* | 4/2012 | Kim | H01L 27/11521 438/514 |
| 2012/0088345 A1* | 4/2012 | Chen | H01L 29/6659 257/E21.409 |
| 2012/0097919 A1 | 4/2012 | Speck | |
| 2012/0098070 A1 | 4/2012 | Wang | |
| 2012/0100678 A1 | 4/2012 | Sako | |
| 2012/0119306 A1 | 5/2012 | Ho et al. | |
| 2012/0126421 A1 | 5/2012 | Lee | |
| 2012/0146106 A1 | 6/2012 | Richter | |
| 2012/0181692 A1* | 7/2012 | Heinrich | H01L 21/76807 438/653 |
| 2012/0193798 A1* | 8/2012 | Zhong | H01L 21/76807 257/E21.585 |
| 2012/0196432 A1* | 8/2012 | Yan | H01L 23/485 438/586 |
| 2012/0205728 A1* | 8/2012 | Yin | H01L 29/66545 257/E21.409 |
| 2012/0211837 A1* | 8/2012 | Baars | H01L 21/823475 257/E27.06 |
| 2012/0225534 A1 | 9/2012 | Lee et al. | |
| 2012/0235244 A1* | 9/2012 | Yin | H01L 29/6659 257/E21.409 |
| 2012/0241863 A1 | 9/2012 | Tsai | |
| 2012/0261727 A1* | 10/2012 | Zhong | H01L 29/78 257/E21.586 |
| 2012/0264261 A1 | 10/2012 | Zhu | |
| 2012/0267706 A1* | 10/2012 | Luo | H01L 29/66606 257/329 |
| 2012/0273848 A1 | 11/2012 | Fan | |
| 2012/0273899 A1 | 11/2012 | Wann | |
| 2012/0295412 A1* | 11/2012 | Wang | H01L 29/66545 257/E21.409 |
| 2012/0313148 A1* | 12/2012 | Schultz | H01L 21/76895 257/288 |
| 2012/0313149 A1* | 12/2012 | Yin | H01L 29/66545 257/E21.409 |
| 2013/0001555 A1* | 1/2013 | Yin | H01L 21/28525 257/E21.409 |
| 2013/0015497 A1* | 1/2013 | Yin | H01L 21/823807 257/190 |
| 2013/0015529 A1* | 1/2013 | Zhong | H01L 21/823807 257/369 |
| 2013/0020623 A1 | 1/2013 | Tsui | |
| 2013/0043516 A1 | 2/2013 | Han et al. | |
| 2013/0049078 A1* | 2/2013 | Wang | H01L 23/564 438/303 |
| 2013/0087833 A1* | 4/2013 | Wang | H01L 29/66477 257/E21.409 |
| 2013/0119474 A1 | 5/2013 | Schultz | |

(56) References Cited

U.S. PATENT DOCUMENTS

| | | | |
|---|---|---|---|
| 2013/0134590 A1* | 5/2013 | Nogami | H01L 23/5222 257/741 |
| 2013/0137257 A1 | 5/2013 | Wei | |
| 2013/0137260 A1 | 5/2013 | Alptekin | |
| 2013/0154101 A1* | 6/2013 | Park | H01L 27/10855 257/773 |
| 2013/0175583 A1 | 7/2013 | Yuan | |
| 2013/0193577 A1* | 8/2013 | Tseng | H01L 21/76843 257/774 |
| 2013/0200461 A1* | 8/2013 | Liu | H01L 21/823871 257/E21.585 |
| 2013/0234292 A1* | 9/2013 | Wei | H01L 23/5228 257/536 |
| 2013/0256767 A1 | 10/2013 | Pradhan | |
| 2013/0285157 A1 | 10/2013 | Yin | |
| 2013/0295734 A1* | 11/2013 | Niebojewski | H01L 21/84 438/197 |
| 2013/0299922 A1 | 11/2013 | Choi | |
| 2013/0309856 A1 | 11/2013 | Jagannathan | |
| 2013/0320412 A1 | 12/2013 | Yamasaki | |
| 2013/0320452 A1* | 12/2013 | Wann | H01L 29/6656 257/368 |
| 2013/0320456 A1 | 12/2013 | Golonzka | |
| 2014/0008713 A1 | 1/2014 | Toh | |
| 2014/0051239 A1 | 2/2014 | Breyta | |
| 2014/0077305 A1 | 3/2014 | Pethe | |
| 2014/0084378 A1* | 3/2014 | Harada | H01L 27/0883 257/369 |
| 2014/0124841 A1* | 5/2014 | Xie | H01L 29/78 257/288 |
| 2014/0154846 A1* | 6/2014 | Cheng | H01L 29/66742 438/151 |
| 2014/0209984 A1 | 7/2014 | Liang | |
| 2014/0213042 A1 | 7/2014 | Lei | |
| 2014/0252433 A1* | 9/2014 | Shieh | H01L 21/76897 257/288 |
| 2014/0252630 A1 | 9/2014 | Chang | |
| 2014/0264499 A1 | 9/2014 | Yuan | |
| 2014/0284671 A1 | 9/2014 | Hung et al. | |
| 2014/0306291 A1 | 10/2014 | Alptekin | |
| 2014/0339629 A1* | 11/2014 | Xie | H01L 29/66666 438/270 |
| 2014/0346575 A1* | 11/2014 | Chen | H01L 29/0692 257/288 |
| 2014/0353768 A1* | 12/2014 | Chae | H01L 27/0207 257/401 |
| 2015/0017768 A1* | 1/2015 | Wann | H01L 23/485 438/230 |
| 2015/0021683 A1 | 1/2015 | Xie | |
| 2015/0041909 A1 | 2/2015 | Bouche | |
| 2015/0048455 A1 | 2/2015 | Basker | |
| 2015/0069625 A1* | 3/2015 | Li | H01L 21/76846 257/774 |
| 2015/0097247 A1 | 4/2015 | Cai | |
| 2015/0118837 A1* | 4/2015 | Shieh | H01L 21/76846 438/586 |
| 2015/0170966 A1 | 6/2015 | Tung | |
| 2015/0206804 A1* | 7/2015 | Liou | H01L 21/76816 257/368 |
| 2015/0214113 A1 | 7/2015 | Bouche | |
| 2015/0236106 A1 | 8/2015 | Zaleski | |
| 2015/0270176 A1* | 9/2015 | Xie | H01L 21/76877 257/384 |
| 2015/0307997 A1 | 10/2015 | Lockard | |
| 2015/0332962 A1 | 11/2015 | Chen | |
| 2015/0364371 A1 | 12/2015 | Yen | |
| 2015/0364378 A1* | 12/2015 | Xie | H01L 29/41783 257/368 |
| 2015/0379925 A1 | 12/2015 | Ok | |
| 2016/0005851 A1* | 1/2016 | Song | H01L 27/092 257/401 |
| 2016/0027692 A1 | 1/2016 | Shieh | |
| 2016/0043075 A1 | 2/2016 | Lavole | |
| 2016/0064514 A1 | 3/2016 | Bouche et al. | |
| 2016/0111509 A1* | 4/2016 | Yu | H01L 29/401 438/286 |
| 2016/0181399 A1 | 6/2016 | Jun | |
| 2016/0190263 A1* | 6/2016 | Xie | H01L 21/823418 257/382 |
| 2016/0336271 A1 | 11/2016 | Sell | |
| 2016/0365426 A1* | 12/2016 | Ching | H01L 29/6656 |
| 2017/0004998 A1* | 1/2017 | Pethe | H01L 21/76807 |
| 2017/0053804 A1 | 2/2017 | Lu | |
| 2017/0077311 A1* | 3/2017 | Xu | H01L 29/7391 |
| 2017/0103915 A1 | 4/2017 | Tsai | |
| 2017/0186849 A1* | 6/2017 | Chen | H01L 29/6656 |
| 2017/0194211 A1 | 7/2017 | Lai | |
| 2017/0221891 A1* | 8/2017 | Chen | H01L 21/76895 |
| 2017/0278744 A1* | 9/2017 | Wang | H01L 21/31116 |
| 2017/0287780 A1 | 10/2017 | Park | |
| 2017/0288037 A1 | 10/2017 | Zhong | |
| 2017/0317076 A1* | 11/2017 | Shen | H01L 21/823437 |
| 2018/0040511 A1 | 2/2018 | Kamineni et al. | |
| 2018/0158820 A1* | 6/2018 | Chen | H01L 23/528 |
| 2018/0211875 A1 | 7/2018 | Basker et al. | |
| 2018/0261510 A1* | 9/2018 | Qiu | H01L 21/76897 |
| 2019/0164813 A1* | 5/2019 | Wang | H01L 29/0847 |
| 2019/0229119 A1* | 7/2019 | Chen | H01L 29/4966 |
| 2020/0051906 A1* | 2/2020 | Liaw | H01L 21/76897 |
| 2020/0058757 A1* | 2/2020 | Xie | H01L 21/823431 |
| 2020/0135569 A1* | 4/2020 | Liaw | H01L 21/823437 |
| 2020/0286782 A1* | 9/2020 | Shieh | H01L 21/7684 |
| 2022/0336268 A1* | 10/2022 | Wang | H01L 29/4232 |

FOREIGN PATENT DOCUMENTS

| | | |
|---|---|---|
| CN | 103199063 | 7/2013 |
| JP | 2013516083 | 5/2013 |
| KR | 100630749 | 10/2006 |
| KR | 1020090044528 | 5/2009 |

\* cited by examiner

METHOD OF SEMICONDUCTOR INTEGRATED CIRCUIT FABRICATION

CROSS-REFERENCE TO RELATED APPLICATIONS

This application is a continuation of U.S. application Ser. No. 14/875,535, filed Oct. 5, 2015, which is a division of U.S. application Ser. No. 14/066,889, filed on Oct. 30, 2013, titled "Method of Semiconductor Integrated Circuit Fabrication", now U.S. Pat. No. 9,153,483, issued Oct. 6, 2015, the entire disclosures of which are incorporated herein by reference.

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more robust metal plug formation for interconnection structures. It is desired to have improvements in this area

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
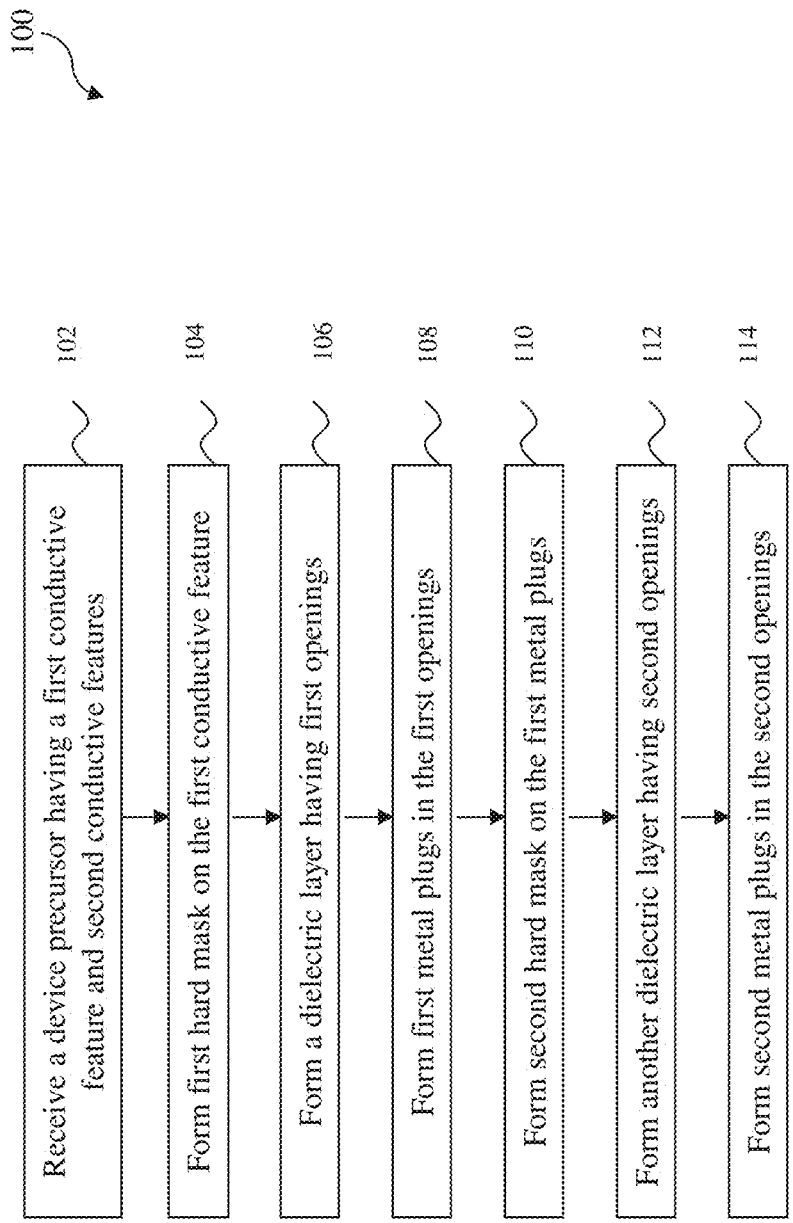
FIG. 1 is a flowchart of an example method for fabricating a semiconductor integrated circuit (IC) constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of one embodiment of a method 100 of fabricating one or more semiconductor devices according to aspects of the present disclosure. The method 100 is discussed in detail below, with reference to a semiconductor device precursor 200 shown in FIG. 2 and a semiconductor device 500 shown in FIGS. 3A-3B, 4 to 8 for the sake of example. It is understood that additional steps can be provided before, during, and after the method, and some of the steps described can be replaced or eliminated for other embodiments of the method.

Figure 2:
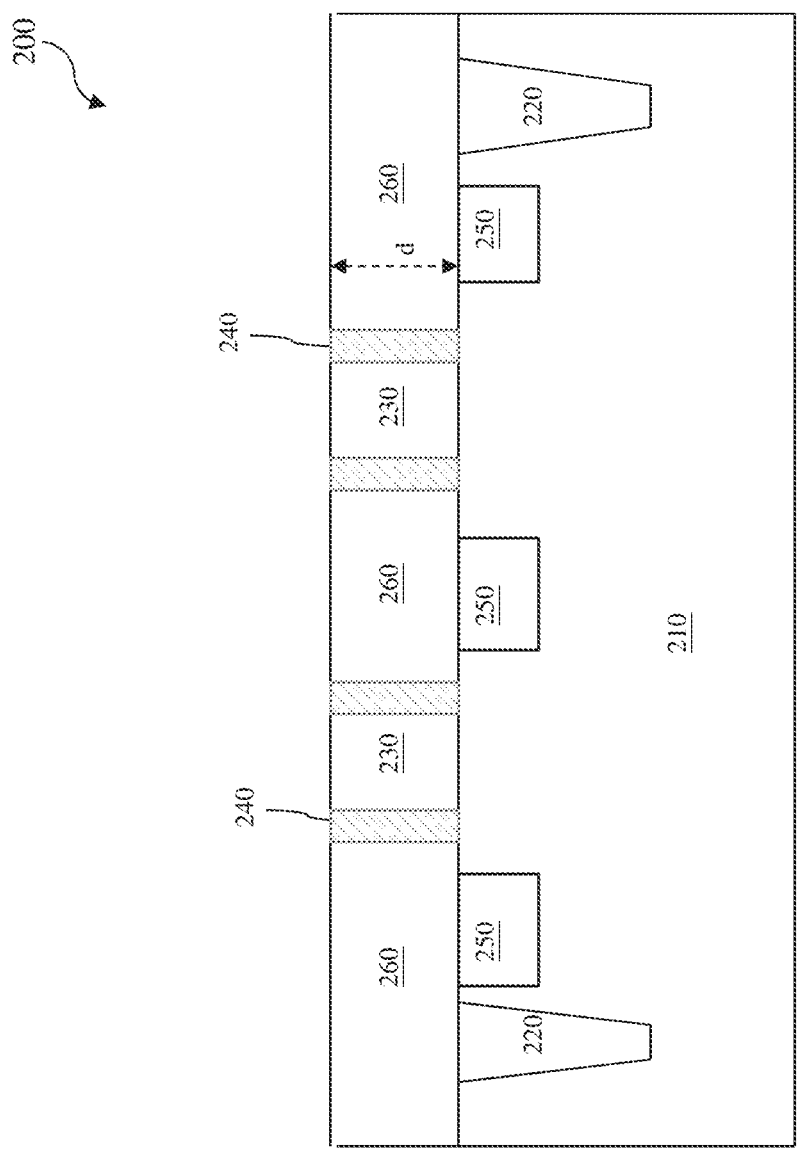
FIGS. 2 to 8 are cross-sectional views of an example semiconductor integrated circuit (IC) at fabrication stages constructed according to the method of FIG. 1.

Referring to FIGS. 1 and 2, the method 100 begins at step 102 by receiving a semiconductor device precursor 200. The semiconductor device precursor 200 includes a substrate 210. In the present embodiment, the substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device precursor 200 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The semiconductor device precursor 200 also includes one or more first conductive features 230. In one embodiment, the first conductive feature 230 may include high-k/metal gates (HK/MGs), a three-dimension HK/MGs wrapping over a fin-like structure. As an example, the HK/MGs may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. Additionally, sidewall spacers 240 are formed on the sidewalls of the HK/MGs. The sidewall spacers 240 may include a dielectric material such as silicon oxide. Alternatively, the sidewall spacers 240 may include silicon nitride, silicon carbide, silicon oxynitride, or combinations thereof. The sidewall spacers 240 may be formed by deposition and dry etching processes known in the art.

In another embodiment, the first conductive features 230 include electrodes, capacitors, resistors or a portion of a resistor. In yet another embodiment, the first conductive features 230 include a portion of the interconnect structure. For example, the first conductive features 230 include contacts, metal vias, or metal lines.

The semiconductor device precursor 200 also includes second conductive features 250 in the substrate 210. A top surface to the second conductive feature 250 may not be at a same horizontal level as a top surface of the first conductive feature 230. In one embodiment, the top surface of the second conductive features 250 are horizontally below the top surface of the first conductive features 230 with a depth d, as shown in FIG. 2. In one embodiment, the second conductive features 250 include doped regions (such as sources or drains), or gate electrodes. In another embodiment, the second conductive features 250 include electrodes, capacitors, resistors or a portion of a resistor, or a portion of the interconnect structure.

The semiconductor device precursor 200 also includes a first dielectric layer 260 deposited over the substrate 210, including between/over each of the first conductive features 230 and over the second conductive features 250. The first dielectric layer 260 includes silicon oxide, silicon nitride, oxynitride, a dielectric material having a dielectric constant (k) lower than thermal silicon oxide (therefore referred to as low-k dielectric material layer), or other suitable dielectric material layer. The first dielectric layer 260 includes a single layer or multiple layers. A CMP may be performed to remove excessive the first dielectric layer 260 to expose the top surface of the first conductive features 230, as well as to provide a substantially planar top surface for the first conductive features 230 and the first dielectric layer 260.

Figure 3A:
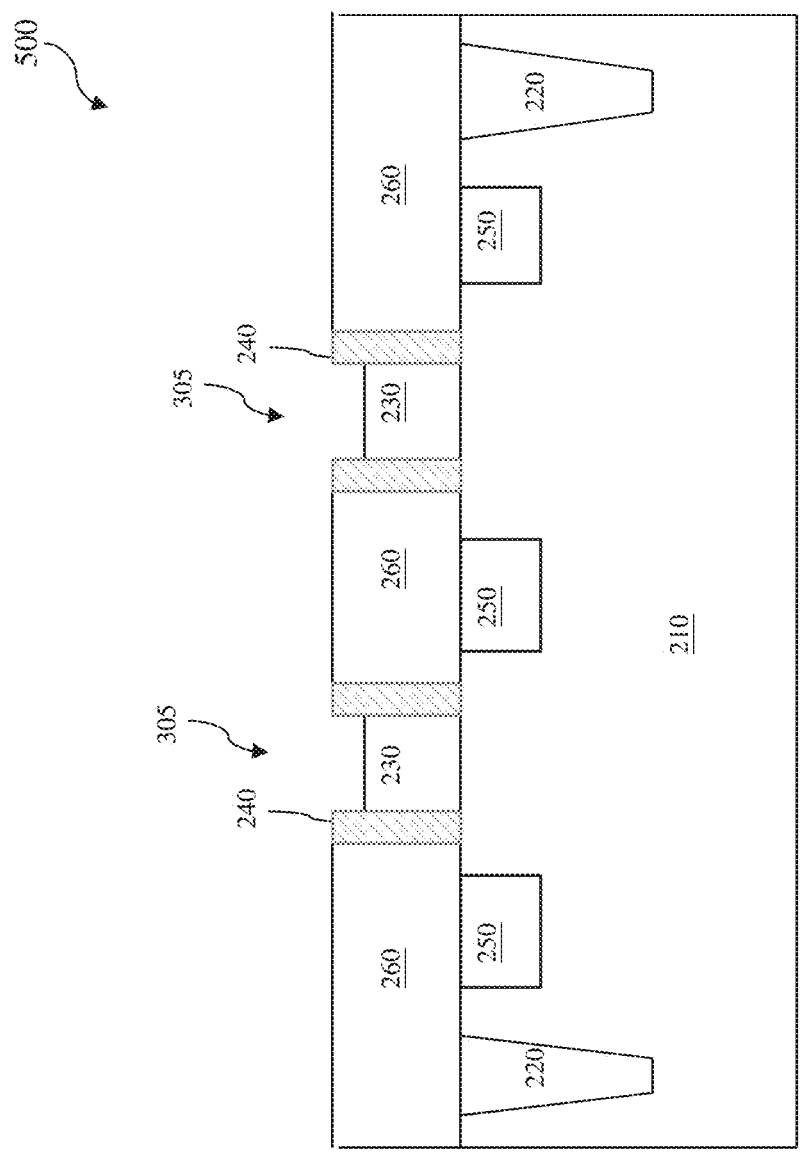
Figure 3B:
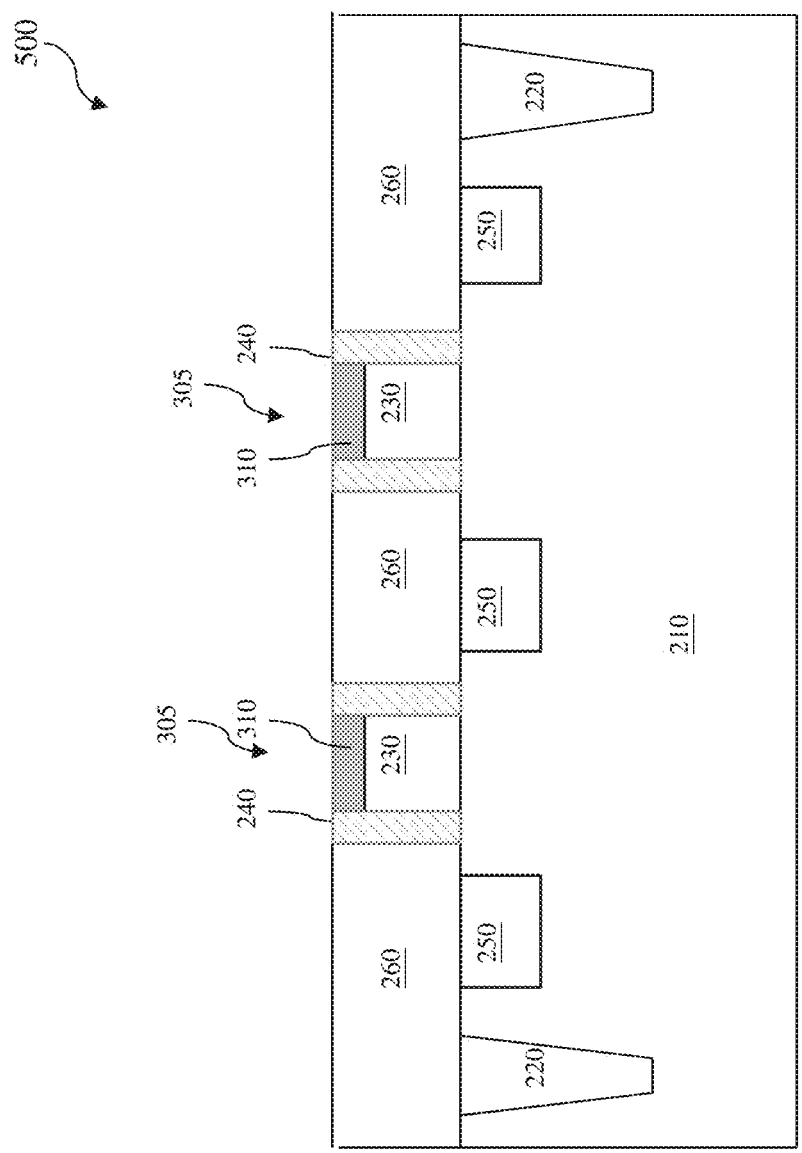

Referring FIGS. 1 and 3A-3B, once the semiconductor device precursor 200 is received, the method 100 proceeds to step 104 by forming a first hard mask (HM) layer 310 on the first conductive features 230. In one embodiment, the first conductive features 230 are recessed first by a selective etch to form first trenches 305, as shown in FIG. 3A. The selective etch may include a wet etch, a dry etch, or a combination thereof. In another embodiment, the first trenches 305 are formed by proper processes including patterning and etching. The first trenches 305 are then filled in by the first HM layer 310 by suitable techniques, such as chemical vapor deposition (CVD), or physical vapor deposition (PVD). The first HM layer 310 includes titanium oxide, tantalum oxide, silicon nitride, silicon oxide, silicon carbide, and silicon carbide nitride. In the present embodiments, the HM layer 310 is different from the first dielectric layer 260 to achieve etching selectivity during a subsequent etch, which will be described later. In one embodiment, a CMP process is then performed to remove excessive the first HM layer 310. The CMP process is controlled such that the first HM layer 310 above the first trenches 305 are removed, thus the portion of the first HM layer 310 in the first trenches 305 become a top layers of the first conductive features 230, as shown in FIG. 3B.

Figure 4:
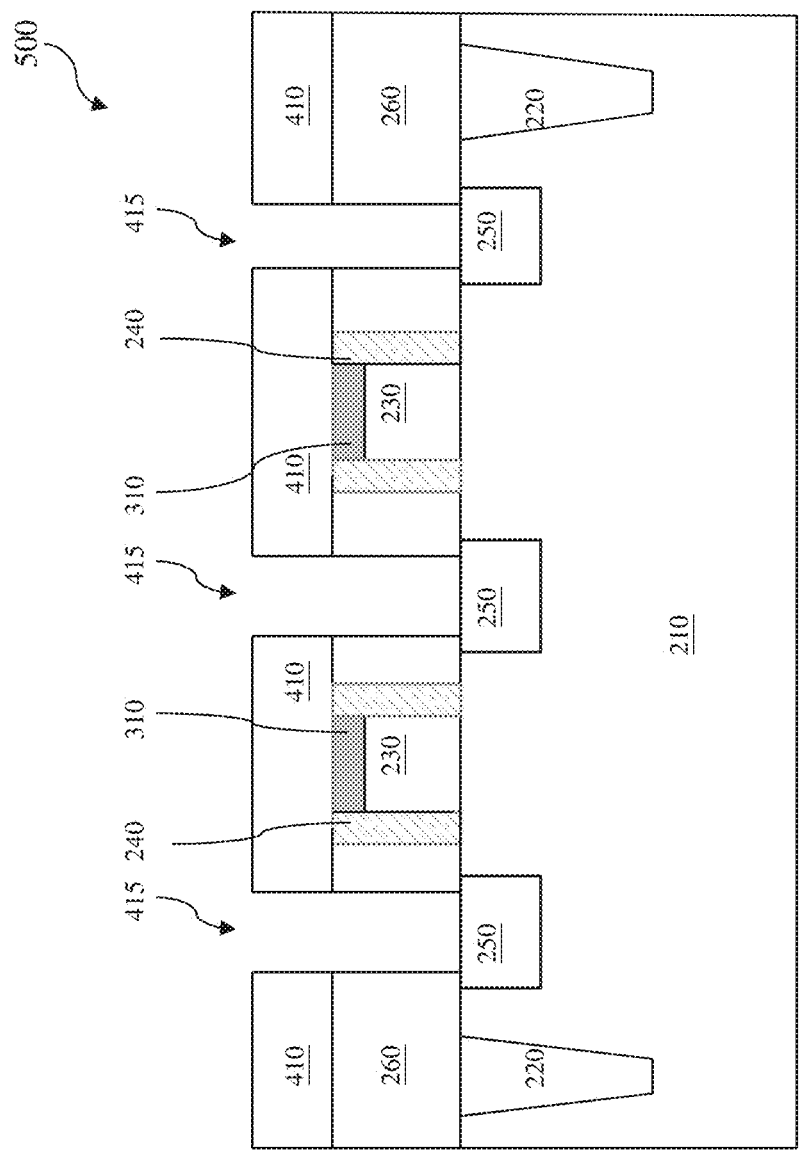

Referring FIGS. 1 and 4, the method 100 proceeds to step 106 by forming a second dielectric layer 410, with first openings 415, over the substrate 210. The second dielectric layer 410 is similar in many respects to the first dielectric layer 260 discussed above in association with FIG. 2. At the bottom of the first openings 415, a portion of the second conductive features 250 are exposed. The first openings 415 may be formed by lithography patterning and etching processes. In present embodiment, the first openings 415 are formed aligning to the respective second conductive features 250 and not aligning to the first conductive features 230, as shown in FIG. 4. With a substantial same depth of the first openings 415, an etching process window may be improved. In one embodiment, the first openings 415 are formed by an etch process that selectively removes the second dielectric layer 410 and the first dielectric layer 260 but substantially does not etch the sidewall spacers 240 and the first HMs 310. Thus, with protection of the sidewall spacers 240 and the first HMs 310, constrains of overlay in first opening patterning process is relaxed and etching process window is improved as well.

Figure 5:
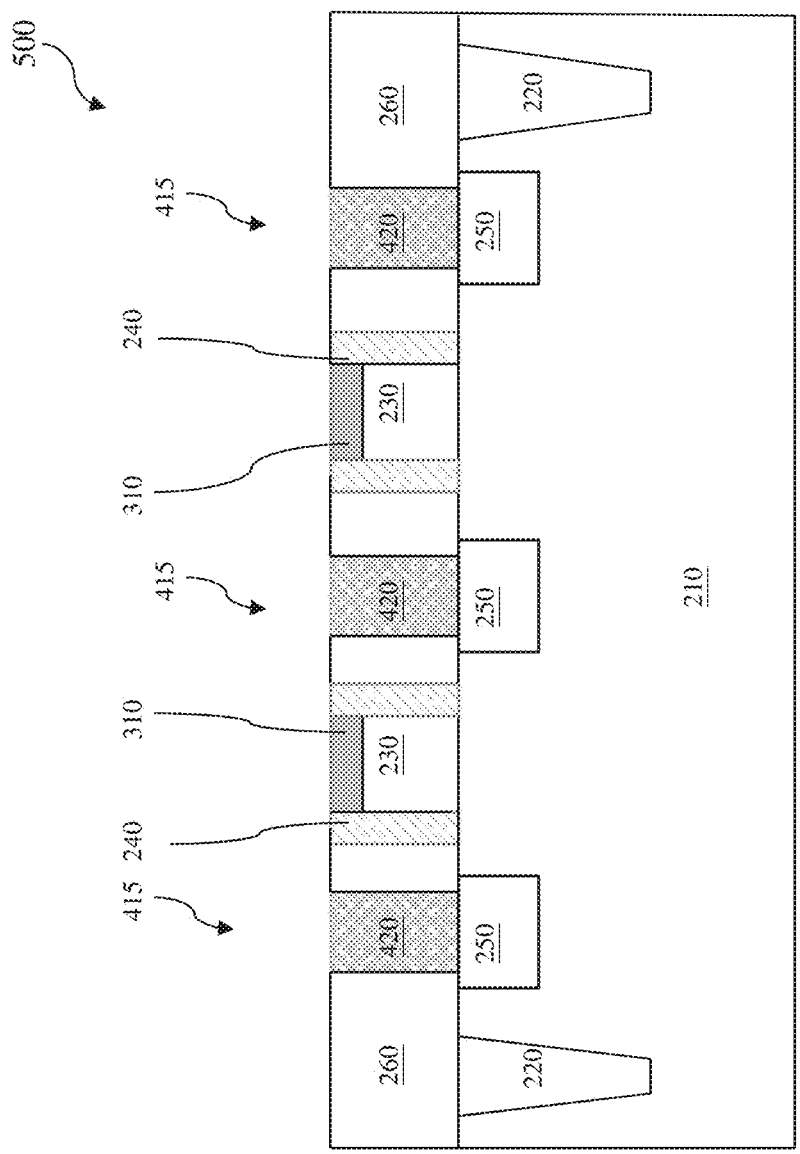

Referring to FIGS. 1 and 5, the method 100 proceeds to step 108 by forming first metal plugs 420 in the first openings 415 to form full contacts extending down to the second conductive features 250. In one embodiment, a first barrier layer is formed in the first openings 415 first by a proper deposition technique, such as PVD and CVD. The first barrier layer may include a metal and is electrically conductive but does not permit inter-diffusion and reactions between the first dielectric material layer 260 and a first metal layer 420 to be filled in the first openings 415. The first barrier layer may include refractory metals and their nitrides. In various examples, the first barrier layer includes TiN, TaN, Co, WN, TiSiN, TaSiN, or combinations thereof. The first barrier layer may include multiple films.

The first metal layer 420 then fills in the first openings 415, as well as over the first barrier layer. The first metal layer 420 may include copper (Cu), aluminum (Al), tungsten (W), copper or copper alloy, such as copper magnesium (CuMn), copper aluminum (CuAl) or copper silicon (CuSi), or other suitable conductive material. The first metal layer 420 may be deposited by y PVD, CVD, metal-organic chemical vapor deposition (MOCVD), or plating.

In the present embodiment, after the first openings 415 are filled by the first metal layer 420, a recess is performed to etch back the excessive first metal layer 420, as well as the excessive first barrier layer, and the second dielectric layer 410 and provide a substantially planar surface. The recess is controlled that it etches back until the top surface of the first HMs 310 are exposed. As an example, a CMP is performed to polish back the excessive first metal layer 420, as well as the excessive first barrier layer, and the second dielectric layer 410. Thus a portion of the first metal layer 420, which fills in the first openings 415, forms the first metal plugs 420. By filling in the first openings 415 first and then recessing back, the first metal plugs 420 are formed with a self-alignment nature. Also combining with the sidewall spacers 240, the first HMs 310 provide an electrical isolation to prevent electrical short between the first metal plugs 425 and the first conductive features 230.

Figure 6:
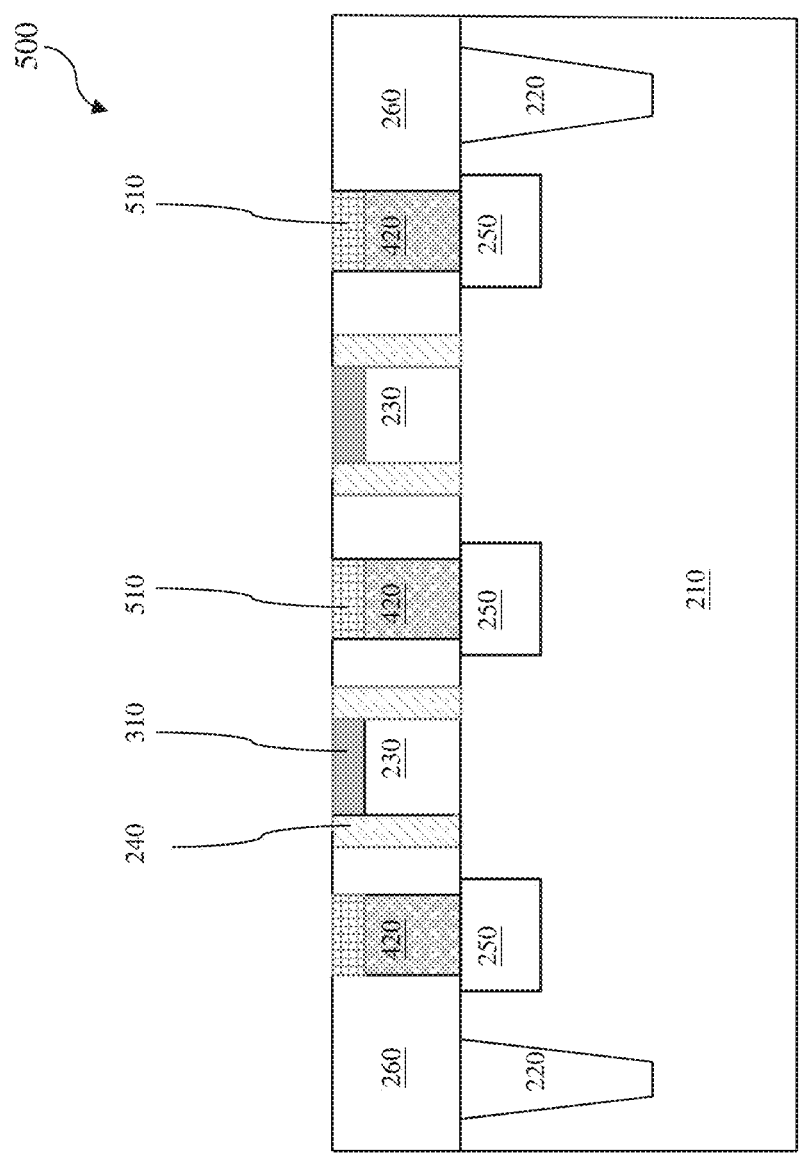

Referring to FIGS. 1 and 6, the method 100 proceeds to step 110 by forming second HMs 510 on the first metal plugs 425. The second HMs 510 are formed similarly in many respects to the first HMs 310 discussed above in association with FIGS. 3A and 3B. The second HM layer 510 includes titanium oxide, tantalum oxide, silicon nitride, silicon oxide, silicon carbide, and silicon carbide nitride. In one embodiment, the first metal plugs 420 are recessed first by a selective etch to form second trenches. The second trenches are then filled in by the second HM layer 510 and a recess process is then performed to remove excessive the HM layer 510. Therefore the portion of the second HM layer 510 filled in the second trenches become top layers of the first metal plugs 420. In the present embodiment, the recess is controlled that it etches back the second HM layer 510 until the top surface of the first HMs 310 are exposed. Thus, as top layers on the first conductive features 230 and the first metal plugs 420, respectively, the firsts HM 310 and the second HMs 510 provide isolation layers to prevent electric short between them and a to-be-formed second metal plug, which will be described later.

Figure 7:
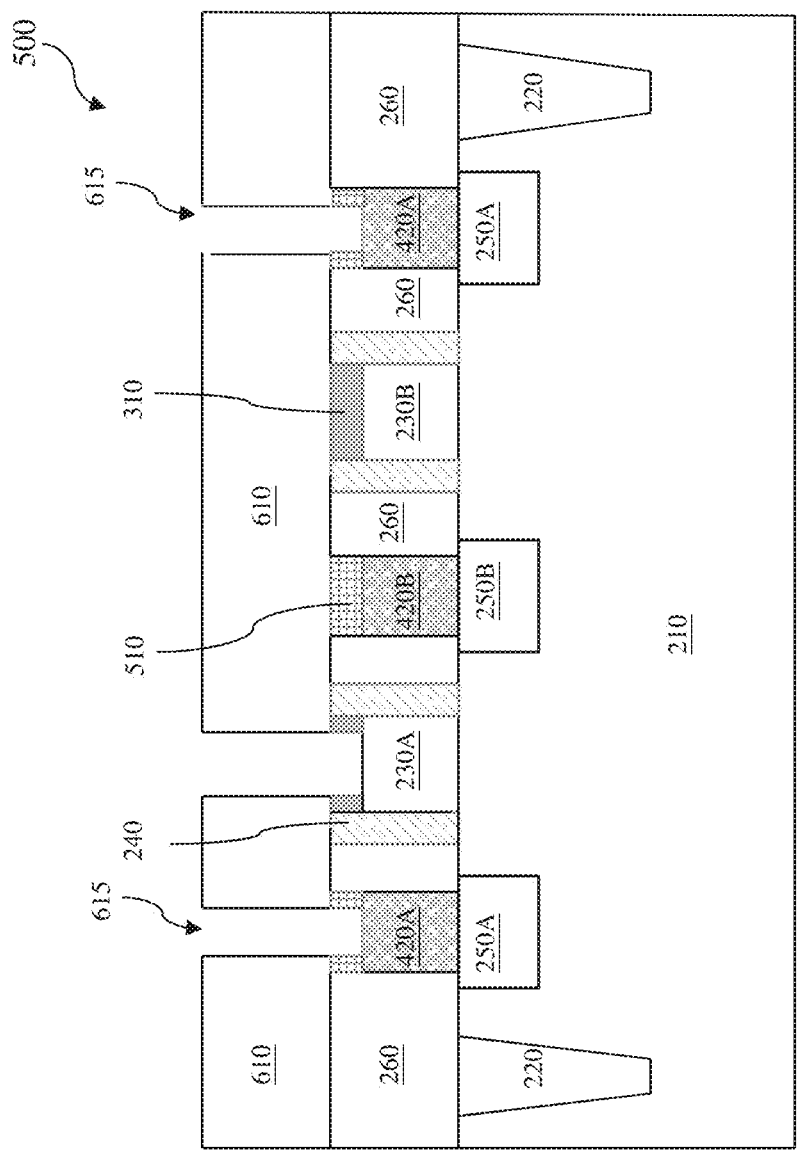

Referring to FIGS. 1 and 7, the method 100 proceeds to step 112 by forming the third dielectric layer 610, with second openings 615, over the substrate 210, including over the first conductive features 230 and the first metal plugs 420. The third dielectric layer 610 and the second openings 615 are formed similarly in many respects to the second dielectric layer 410 and the first openings 415 discussed above in association with FIG. 4. The second openings 615 are formed to expose a subset of the first conductive features 230 and the first metal plugs 420 (which connecting with the second conductive feature 250). For the sake of clarity to better describing the method 100, now labeling the subset of the first conductive features 230, the first metal plugs 420 and the second conductive features 250 with the reference number 230A, 420A and 250A, respectively, and labeling rest of the first conductive features 230, the first metal plugs 420 and the second conductive feature 250 with the reference number 230B, 420B and 250B, respectively. In one embodiment, the second openings 615 are formed by lithography patterning and etching processes. The first HM 310 on the first conductive feature 230A and the second HM 510 on the first metal plug 420A are moved during the etch process as well. With a substantial same depth of the second opening 615, an etching process window is improved.

Figure 8:
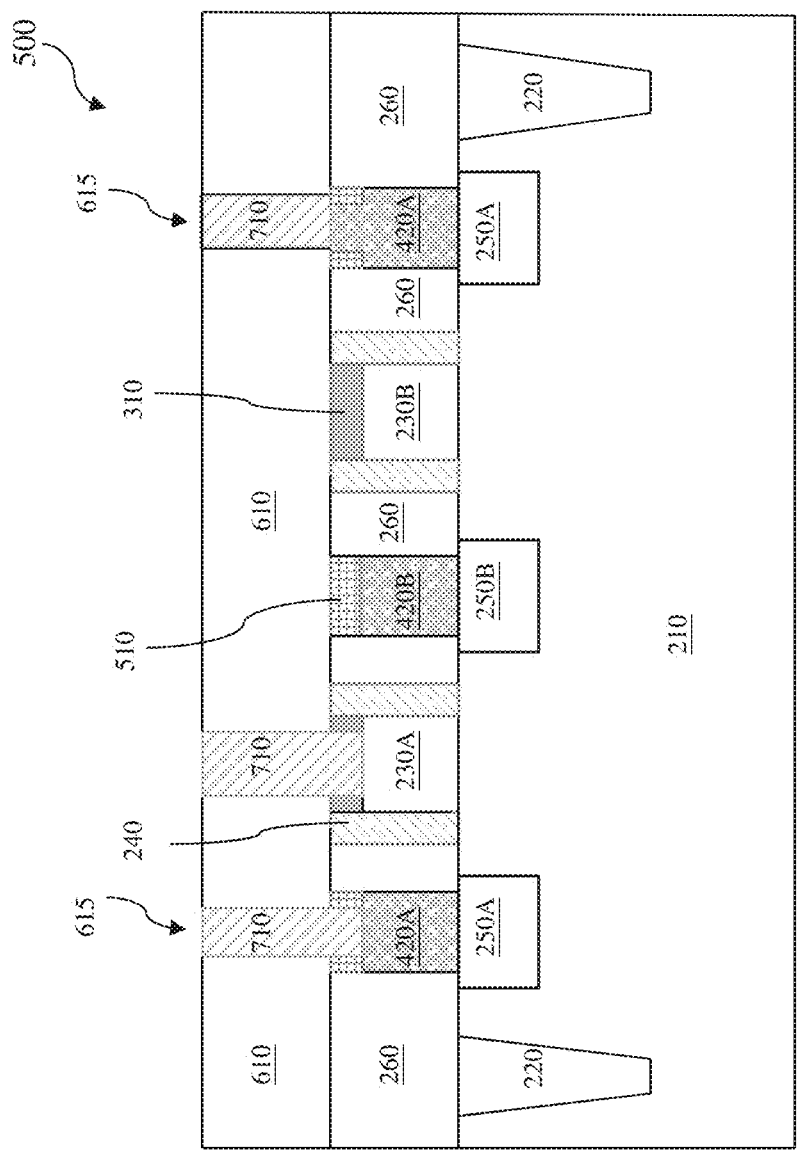

Referring to FIGS. 1 and 8, the method 100 proceeds to step 114 by forming a second metal plugs 710 in the second openings 615 to form a full contact extending down to the first conductive features 230A and the first metal plugs 420A. Thus, the second metal plugs 710 are formed similarly in many respects to the first metal plug 420 discussed above in association with FIG. 5. In one embodiment, a second barrier layer is formed in the second openings 615 first. The second barrier layer may include refractory metals and their nitrides. In various examples, the second barrier layer includes TiN, TaN, Co, WN, TiSiN, TaSiN, or combinations thereof. The second barrier layer may include multiple films.

The second metal layer 710 then fills in the second openings 615, including depositing over the second barrier layer. The second metal layer 710 may include copper (Cu), aluminum (Al), tungsten (W), copper or copper alloy, such as copper magnesium (CuMn), copper aluminum (CuAl) or copper silicon (CuSi), or other suitable conductive material. A recess is then performed to etch back the excessive second metal layer 710, as well as the excessive second barrier layer, to form the second metal plugs 710 and a substantial planar surface with the third dielectric layer 610.

By filling in the second openings 615 first and then recessing back, the second metal plugs 710 are formed with a self-alignment nature. During the forming of the second metal plugs 710, the first HMs 310 and the second HMs 510 enhance protection between the first conductive features 230B and the first metal plugs 420B to the second metal plugs 710, which relaxes process constrains and improves process window.

In the present embodiment, a vertical conductive connection for the second conductive feature 250A, is provided by two metal plugs on top of each other, the second metal plug 710 on top of the first metal plug 420A, instead of one metal plug. Usually during forming an opening, the opening becomes narrower as it extends deeper. Thus, to achieve a targeted bottom size of an opening, a deeper opening usually need a wider opening at its top. Therefore a spacing separating two adjacent openings may become smaller. A smaller separating spacing may make process window be narrower, such as a smaller tolerance for misalignment. It may also lead more constrains in reducing device packing density. Thus, instead of one deeper opening, in this two plug scheme, each opening forms as a portion of the deeper opening and therefore a smaller top width (comparing with a deeper opening) may be achieved.

Additional steps can be provided before, during, and after the method 100, and some of the steps described can be replaced, eliminated, or moved around for additional embodiments of the method 100. For example, prior to depositing the second dielectric layer 410 (in step 106), an etch stop layer is deposited over the substrate to enhance etch process control in recessing the first metal layer 420 (in step 108). The device 500 may undergo further CMOS or MOS technology processing to form various features and regions.

Based on the above, the present disclosure offers a method for fabricating a semiconductor device. The method employs forming a hard mask as a top layer of a conductive feature to protect the respective conductive feature during a formation of a metal plug to connect another conductive feature. The method also employs forming a metal plug with a self-alignment nature. The method demonstrates an integration of interconnection with a relaxed process constrains, enhanced electrical short protection and improved process window.

The present disclosure provides many different embodiments of fabricating a semiconductor IC that provide one or more improvements over existing approaches. In one embodiment, a method for fabricating a semiconductor integrated circuit (IC) includes providing a first conductive feature and a second conductive feature in a substrate. The first and the second conductive features are separated by a first dielectric layer. A top surface of the second conductive feature is below a top surface of the first conductive feature, horizontally. The method also includes forming a first hard mask (HM) as a top layer on the first conductive feature, depositing a second dielectric layer over the first and the second conductive features, forming the first openings in the first and the second dielectric layers to expose the second conductive features, forming a first metal plug in the first openings to contact the second conductive features, forming a second HM as a top layer on the first metal plugs, depositing a third dielectric layer over the first conductive feature and the first metal plugs, forming second openings in the third dielectric layer to expose a subset of the first conductive features and the first metal plugs and forming second metal plugs in the second openings to connect to the subset of first conductive features and the first metal plugs.

In another embodiment, a method for fabricating a semiconductor IC includes providing a device precursor. The device precursor includes high-k/metal gates (HK/MGs) in a substrate, sidewall spacers along HK/MG sidewalls, conductive features in the substrate and a first dielectric layer to separate the HK/MGs and the second conductive features. A top surface of the conductive feature is below a top surface of the HK/MGs, horizontally. The method also includes recessing the HK/MGs to form first trenches on the HK/MGs, forming first hard masks (HM) in the first trenches, therefore the first HMs are top layers on the HK/MGs. The method also includes depositing a second dielectric layer over the HK/MGs and the conductive features, forming first openings in the second and the first dielectric layers to expose the conductive features, filling in the first openings with a first metal layer to contact the conductive features, recessing the first metal layer and the second dielectric layer until the first HMs are exposed. Therefore first metal plugs are formed in the first openings. The method also includes forming a second HM as a top layer on the first metal plugs, depositing a third dielectric layer over the HK/MGs and the first metal plugs, forming second openings in the third dielectric layer to expose a subset of the HK/MGs and the first metal plugs and forming second metal plugs in the second openings to connect with the subset of HK/MGs and the first metal plugs.

In yet another embodiment, a method for fabricating a semiconductor IC includes providing a first conductive feature and a second conductive feature in a substrate, separated by a first dielectric layer. The method also includes forming a first hard mask (HM) as a top layer on the first conductive feature, forming a first patterned dielectric layer over the first and the second conductive features. Therefore the first patterned dielectric layer having openings to expose the second conductive features. The method also includes forming a first metal plug in the first openings to connect the second conductive features, forming a second HM as a top layer on the first metal plugs, forming a second patterned dielectric layer over the first conductive features and the first metal plugs. Therefore the second patterned dielectric layer having second openings to expose the first conductive feature and a subset of the first metal plugs and forming second metal plugs in the second openings to connect to connect the first conductive feature and the subset of the first metal plugs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a plurality of first conductive features disposed over a substrate;
    a plurality of spacers disposed on sidewalls of the first conductive features, respectively;
    a plurality of first hard masks disposed over the first conductive features, respectively;
    a plurality of second conductive features disposed in the substrate;
    a plurality of first metal plugs disposed over the second conductive features, respectively;
    a plurality of second hard masks disposed over the first metal plugs, respectively;
    a plurality of second metal plugs disposed over the first conductive features and over the first metal plugs, respectively, wherein a first one of the second metal plugs vertically extends through a first one of the first hard masks and is disposed directly above a first one of the first conductive features, a second one of the second metal plugs vertically extends through a first one of the second hard masks and is disposed directly above a first one of the first metal plugs, wherein the first one of the first hard masks surrounds opposite sides of a lower portion of the first one of the second metal plugs in a cross-sectional side view, wherein none of the second metal plugs is disposed directly above a second one of the first conductive features or above a second one of the first metal plugs, wherein a third one of the second metal plugs is disposed directly above a third one of the first metal plugs, wherein the second one of the second metal plugs and the third one of the second metal plugs have no other ones of the second metal plugs disposed therebetween, and wherein bottom surfaces of the first one of the second hard masks are co-planar with a bottom surface of the second one of the second metal plugs;
    a first dielectric layer disposed over the substrate between the first conductive features and the first metal plugs; and
    a second dielectric layer disposed over the first dielectric layer, over the first hard masks, and over the second hard masks, wherein a bottom surface of the second dielectric layer is in contact with an entire upper surface of a second one of the first hard masks and with an entire upper surface of a second one of the second hard masks, wherein the second one of the second hard masks is disposed directly over the second one of the first metal plugs, wherein the first one of the first conductive features is disposed between the first one of the first metal plugs and the second one of the first metal plugs, such that the first one of the first conductive features is disposed directly adjacent to a first one of the spacers, the second one of the first metal plugs is disposed directly adjacent to a first portion of the first dielectric layer, and the first one of the spacers is disposed directly adjacent to the first portion of the first dielectric layer, and wherein none of the second metal plugs extends vertically through the second one of the first hard masks or the second one of the second hard masks.

2. The device of claim 1, wherein:
the first conductive features each includes a gate structure;
the second conductive features each includes a source/drain; and
the first portion of the first dielectric layer is disposed directly over the source/drain of at least one of the second conductive features and directly over an upper surface of the substrate that is outside the source/drain.

3. The device of claim 1, wherein the first hard masks and the second hard masks include different types of dielectric materials.

4. The device of claim 1, wherein an uppermost surface of one of the first one of the first metal plugs is co-planar with a bottommost surface of the second one of the second metal plugs.

5. The device of claim 1, wherein the first one of the first hard masks is in direct physical contact with one of the spacers.

6. The device of claim 1, wherein the first dielectric layer, the first hard masks, and the second hard masks include different types of dielectric materials and have substantially co-planar upper surfaces.

7. The device of claim 1, wherein the first one of the second metal plugs vertically extends through the first one of the first hard masks and is disposed directly above the first one of the first conductive features in a first cross-sectional side view, and wherein the second one of the second metal plugs vertically extends through the first one of the second hard masks and is disposed directly above the first one of the first metal plugs in the first cross-sectional side view.

8. The device of claim 1, wherein the second metal plugs each vertically extend through the second dielectric layer and are separated from one another by the second dielectric layer, and wherein a bottom surface of the second dielectric layer is more vertically elevated than the bottom surface of the second one of the second metal plugs.

9. The device of claim 1, wherein the first metal plugs and the first conductive features have substantially similar heights.

10. The device of claim 1, wherein: the first one of the first metal plugs is wider than the second one of the second metal plugs in a cross-sectional side view.

11. A device, comprising:
a plurality of gates located over a substrate, wherein the gates include a first gate and a second gate;
a plurality of gate spacers located on sidewalls of each of the gates, respectively;
a plurality of source/drains located in the substrate;
a plurality of first metal plugs located over the source/drains, respectively, wherein the first metal plugs include a first one of the first metal plugs, a second one of the first metal plugs, and a third one of the first metal plugs;
a plurality of first hard masks located over the gates, respectively;
a plurality of second hard masks located over the first metal plugs, respectively;
a first dielectric layer located over the substrate and separating the first metal plugs and the gates;
a second dielectric layer located over the first dielectric layer;
and a plurality of second metal plugs located over at least the first gate and over a first one of the first metal plugs, respectively, wherein a first one of the first hard masks is in contact with opposite side surfaces of a lower portion of a first one of the second metal plugs in a cross-sectional side view;
wherein:
first one of the second metal plugs vertically extends through the first one of the first hard masks and is located directly above the first gate;
a second one of the second metal plugs vertically extends through a first one of the second hard masks and is disposed directly above the first one of the first metal plugs;
a third one of the second metal plugs is disposed directly above the third one of the first metal plugs;
none of the second metal plugs are disposed directly above the second gate or the second one of the first metal plugs;
bottom surfaces of the first one of the second hard masks are co-planar with a bottom surface of the second one of the second metal plugs;
a bottom surface of the second dielectric layer is in contact with an entire upper surface of a second one of the first hard masks and with an entire upper surface of a second one of the second hard masks;
the second one of the second hard masks is located directly over the second one of the first metal plugs; and
the first gate is disposed between the first one of the first metal plugs and the second one of the first metal plugs, such that the first gate is disposed directly adjacent to a first one of the gate spacers, the second one of the first metal plugs is disposed directly adjacent to a first portion of the first dielectric layer, and the first one of the gate spacers is disposed directly adjacent to the first portion of the first dielectric layer.

12. The device of claim 11, wherein the first hard masks are located between the gate spacers and the second metal plugs.

13. The device of claim 11, wherein the first dielectric layer, the first hard masks, the second hard masks, and the gate spacers have substantially co-planar upper surfaces.

14. The device of claim 11, wherein:
the first hard masks and the first dielectric layer have different material compositions; and
the first hard masks and the second dielectric layer have different material compositions.

15. The device of claim 11, wherein the gates each includes a metal-containing gate electrode.

16. The device of claim 11, wherein the first metal plugs and the gates have substantially similar heights.

17. A device, comprising:
a first gate and a second gate each formed over a substrate;
a plurality of gate spacers formed on side surfaces of the first gate and the second gate;
a plurality of first hard masks formed over the first gate and the second gate;
a first source/drain and a second source/drain each located in the substrate;

a plurality of lower level metal plugs formed over the first source/drain and the second source/drain, the lower level metal plugs including a first lower level metal plug, a second lower level metal plug, and a third lower level metal plug, wherein the first gate is disposed between the first lower level metal plug and the second lower level metal plug, and wherein the second gate is disposed between the second lower level metal plug and the third lower level metal plug;

a plurality of second hard masks formed over the lower level metal plugs;

a plurality of upper level metal plugs, wherein a first upper level metal plug is aligned with the first gate and extends vertically through a first one of the first hard masks that is formed over the first gate, wherein the first one of the first hard masks surrounds opposite side surfaces of a bottom portion of the first upper level metal plug in a cross-sectional side view, wherein a second upper level metal plug is aligned with the first source/drain and extends vertically through a first one of the second hard masks that is formed over the first lower level metal plug that is formed over the first source/drain, wherein a third upper level metal plug is disposed directly over a third lower level metal plug, and wherein none of the upper level metal plugs is formed over the second gate or the second source/drain;

a first dielectric layer formed over the substrate; and a second dielectric layer formed over the first dielectric layer;

wherein:

none of the upper level metal plugs are disposed between the first upper level metal plug and the third upper level metal plug;

bottom surfaces of the first one of the second hard masks are co-planar with a bottom surface of the second upper level metal plugs;

a bottom surface of the second dielectric layer is in contact with an entire upper surface of a second one of the first hard masks and with an entire upper surface of a second one of the second hard masks;

the second one of the second hard masks is located directly over the second lower level metal plugs; and the second lower level metal plug is disposed directly adjacent to a first portion of the first dielectric layer.

18. The device of claim 17, further comprising:

wherein the first dielectric layer separates the lower level metal plugs from the gate spacers; and wherein the second dielectric layer separates the upper level metal plugs from each other.

19. The device of claim 17, wherein the first one of the second hard masks surrounds opposite sides of a lower portion of the upper level metal plug in the cross-sectional side view.

20. The device of claim 17, wherein the plurality of the upper level metal plugs are electrically isolated from one another and have co-planar upper surfaces.

\* \* \* \* \*